United States Patent
Cheng et al.

(10) Patent No.: US 7,579,913 B1
(45) Date of Patent: Aug. 25, 2009

(54) LOW POWER COMSUMPTION, LOW NOISE AND HIGH POWER GAIN DISTRIBUTED AMPLIFIERS FOR COMMUNICATION SYSTEMS

(75) Inventors: Yu Cheng, Hsinchu (TW); Albert Kuo-Huei Yen, San Jose, CA (US); Jen-Chung Chang, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/038,374

(22) Filed: Feb. 27, 2008

(51) Int. Cl.
*H03F 3/60* (2006.01)

(52) U.S. Cl. .................. 330/286; 330/54; 330/295

(58) Field of Classification Search .............. 330/286, 330/295, 124 R, 54
See application file for complete search history.

(56) References Cited

U.S. PATENT DOCUMENTS

| | | | |
|---|---|---|---|
| 5,021,743 A * | 6/1991 | Chu et al. ............... | 330/54 |
| 6,215,360 B1 | 4/2001 | Callaway, Jr. | |
| 6,566,956 B2 * | 5/2003 | Ohnishi et al. ........... | 330/295 |
| 6,597,243 B1 * | 7/2003 | Fratti ...................... | 330/54 |
| 6,650,185 B1 * | 11/2003 | Stengel et al. ........... | 330/286 |
| 7,138,871 B2 * | 11/2006 | Retelny, Jr. ............. | 330/296 |
| 7,268,627 B2 * | 9/2007 | Samelis .................. | 330/295 |
| 7,414,477 B2 * | 8/2008 | Joodaki .................. | 330/286 |
| 2001/0047505 A1 | 11/2001 | Mattisson | |

* cited by examiner

*Primary Examiner*—Henry K Choe
(74) *Attorney, Agent, or Firm*—J. C. Patents

(57) ABSTRACT

Provided is a distributed amplifier in communication systems, including: an input transmission line; an output transmission line; an input impedance match and an output impedance match, for providing termination of the input transmission line and the output transmission line, respectively and for preventing signal reflection in the input transmission line and the output transmission line, respectively; multi-stage Gm cells with common mode feedback, the input transmission line being coupled to the output transmission line by the transconductance of the Gm cells; and an input gate bias circuit, for providing bias for the multi-stage Gm cells. In at least one of the Gm cells, one inverter performs V/I conversion while other inverters provide negative resistance to control common mode of output voltage and to enhance DC gain of the Gm cell. Due to common mode feedback, no output gate bias is needed.

20 Claims, 9 Drawing Sheets

LOW POWER COMSUMPTION, LOW NOISE AND HIGH POWER GAIN DISTRIBUTED AMPLIFIERS FOR COMMUNICATION SYSTEMS

BACKGROUND OF THE INVENTION

1. Field of Invention

The present invention is directed generally to the field of electronic amplifiers, and particularly to distributed amplifiers (DA) for use in power output stages and/or receiving part of RF (Radio Frequency) communication products.

2. Description of Related Art

In communication systems such as RF transceivers, it is desirable to integrate as much circuitry as possible on a single semiconductor chip. The main function blocks in the RF transceivers are Low Noise Amplifier (LNA) in the receiver part and Power Amplifier (PA) in the transmitter part. However, it challenges to design the 2 block circuits because of wide bandwidth, low noise, high gain, and low power consumption.

This has not been practical for most such products because of the power requirements associated with the transmitter's power output stage (sometimes referred to herein as a power amplifier) and low noise requirements associated with the receiver's low noise amplifier (LNA). Consequently, they have usually been constructed as an off-chip, discrete LNA or PA.

From monolithic microwave IC (MMIC) to currently CMOS (Complimentary Metal Oxide Semiconductor) RFIC design, the evolution of circuit design proofed that Distributed Amplifier (DA) circuit plays an important rule more and more, no matter in receiver part as LNA or in transmitter part as PA, especially in CMOS technology. The DA structure has been used successfully in the RF front-end applications.

A prior art distributed amplifier (DA) 100 is shown in FIG. 1. The prior DA 100 includes an input transmission line 110, an output transmission line 120, and multiple transistor stages 130 that couple the transmission lines 110 and 120 together by the transconductance of the transistor stages 130.

The input transmission line 110 includes inductors 111 at the beginning and end of the transmission line 110, and a series of inductors 112 connected between the inductors 111. The input transmission line 110 is terminated by a resistance 146 of 50 ohms, with an RF bypass capacitor 147 coupled between the resistance 146 and ground. The output transmission line 120 includes an inductor 121 at each end of the transmission line, and a series of inductances 122 connected between inductances 121. The value of inductors 121 is equal to the value of inductors 111, and the value of inductors 122 is equal to the value of inductors 112.

The power supply Vdd is coupled to the transmission line 120 by an RF choke 141. The termination for the output transmission line 120 is provided by a 50 ohm resistance 144, with an RF bypass capacitor 145 coupled between the resistance 144 and ground.

The input transmission line 110 is coupled to the output transmission line 120 by the transconductance of N stages of transistors 130. The gate of each transistor is coupled to a junction between adjacent inductors in the input transmission line 110. The source of each transistor is grounded, with its drain coupled to a junction between adjacent inductors in the output transmission line 120.

Bias for the transistor stages 130 is provided by a current source 149 coupled in series with the drain of a transistor 150. With the drain of the transistor 150 coupled to its gates, and the gate of the transistor 150 coupled to the input transmission line 110 through an isolating resistance 148, equal bias currents are established in each of the transistor stages 130. That bias current is substantially equal to the current supplied by the current source 149.

The gate and drain capacitances of the transistors 130 are absorbed into the inductors 111, 112, 121, and 122, thereby forming artificial transmission lines. When an input signal is applied to the amplifier's input terminal 142, the signal travels down the transmission line 110 to the terminating resistance 146 which absorbs the signal, thereby preventing any signal reflection. As the input signal travels down the input transmission line, each transistor 130 becomes excited by the traveling signal and transfers the signal to the output transmission line through its transconductance. The signals output by the transistors 130 are summed at an output terminal 143. Any signal that propagates in the opposite direction is absorbed by the resistance 144.

Most prior DA circuits are built with simply one NMOS common source inverter structure with extra internal or external bias circuit and even the matching circuits are tuned by external components. This caused the noise figure and poor linearity.

SUMMARY OF THE INVENTION

The present invention is to provide low power consumption, low noise and high power gain DA for communication systems, due to current re-use mechanism, and accordingly no output drain bias is needed.

In one example of the invention, a distributed amplifier in an RF signal transreceiver is provided. The DA includes: an input transmission line, having an input for receiving an input signal to be amplifier; an output transmission line, having an output at which an output signal is provided; an input impedance match, for providing termination of the input transmission line and for preventing signal reflection in the input transmission line; an output impedance match, for providing termination of the output transmission line and for preventing signal reflection in the output transmission line; multi-stage Gm (transconductance) cells with common mode feedback, coupled between the input transmission line and the output transmission line, the input transmission line being coupled to the output transmission line by the transconductance of the Gm cells; and an input gate bias circuit, for providing bias for the multi-stage Gm cells; wherein at least one of the Gm cells including a plurality of inverters, one of the inverters being for performing V/I conversion, and the others of the inverters being for providing negative resistance to control common mode of output voltages of the Gm cell and to enhance DC gain of the Gm cell.

In another example of the invention, a DA in an RF signal transreceiver is further provided. The DA includes: an input transmission line, having an input for receiving an input signal to be amplifier; an output transmission line, having an output at which an output signal is provided; an input impedance match, for providing termination of the input transmission line and for preventing signal reflection in the input transmission line; an output impedance match, for providing termination of the output transmission line and for preventing signal reflection in the output transmission line; multi-stage Gm (transconductance) cells with common mode feedback, coupled between the input transmission line and the output transmission line, the input transmission line being coupled to the output transmission line by the transconductance of the Gm cells; and an input gate bias circuit, for providing bias for the multi-stage Gm cells; wherein at least one of the Gm cells including: a first CMOS inverter, coupled between an input node and an output node of the Gm cell, the first CMOS inverter being for performing V/I conversion; and second, third, fourth and fifth CMOS inverters, coupled to the first CMOS inverter, the second, third, fourth and fifth CMOS inverters being for providing negative resistance to control common mode of output voltage of the Gm cell and to enhance DC gain of the Gm cell; the negative resistance, expressed by expressed by $$gn = -\frac{1}{gm4 - gm5},$$

being Implemented by choosing: gm4>gm5, gm3=gm4, gm2=gm5, gm2~gm5 refer to transconductance values of the second, third, fourth and fifth CMOS inverters.

In order to make the aforementioned and other objects, features and advantages of the present invention comprehensible, a preferred embodiment accompanied with figures is described in detail below.

DESCRIPTION OF EMBODIMENTS

One of embodiments according to the invention shows the design and fabrication of a low power consumption, low noise and high power gain CMOS distributed amplifier (DA) for ultra-wideband (UWB) wireless applications. The proposed topology is implemented in CMOS MMRF technology and Process Design Kit (PDK). The measurement results show the amplifier achieves a flat forward gain (S21) of 8.3 dB and a noise figure as low as 3.3 dB over a wide bandwidth. S parameter S11 is lower than −15 dB for Mode 1 OFDM applications. The input 1 dB compression points (PldB) parameters are −5.8 dBm, −7.8 dBm, and −8 dBm when the input injected frequencies are at 2 GHz, 4 GHz, and 6 GHz, respectively. Biased by an internal negative resistance circuit, the power consumptions of the DA circuit are 29.8 mW under 1.2V power supply.

This embodiment according to the invention proposes a UWB DA based on Gm (transconductance) cells with common mode feedback to overcome the problems of linearity and noise figure. Further, via negative resistance provided by the Gm cells with common mode feedback, the power gain is further enhanced. The experimental results verify good linearity, noise figure, gain curve flatness, and input impedance match over very wide frequency band. DA circuit is originated from MMIC on GaAs with the transmission line for a very wide bandwidth and constant gain. Nowadays CMOS era, on-chip spiral inductors may be used as transmission lines and accordingly it is possible to integrate the DA circuits in an SOC chip. 0.13 μm MMRF CMOS process has thicker metallization than a typical CMOS process. In this process, 2 μm top-layer Aluminum metallization may be used to assess good performance of monolithic inductor.

Figure 2:
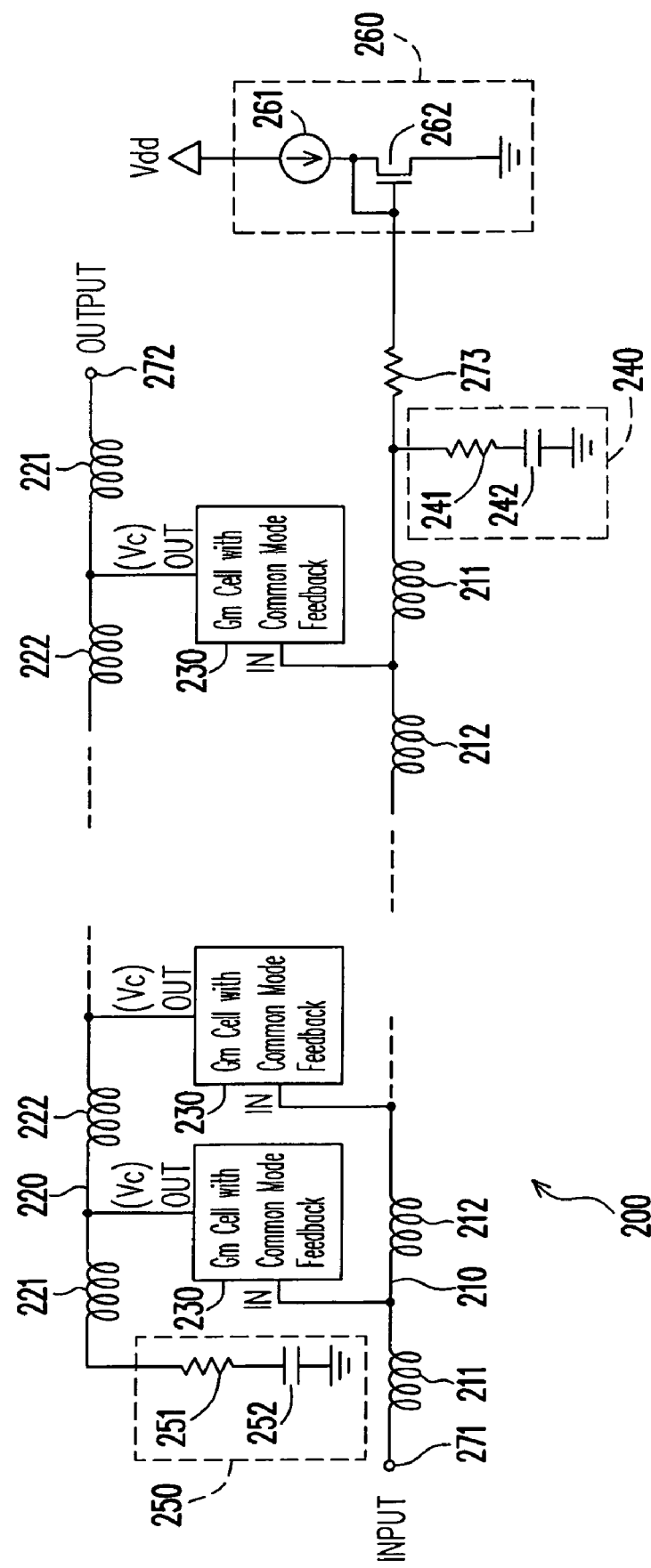
FIG. 2 shows a distributed amplifier (DA) circuit 200 according to the embodiment of the invention.

FIG. 2 shows a distributed amplifier (DA) circuit 200 according to the embodiment of the invention. The distributed amplifier 200 includes an input transmission line 210, an output transmission line 220, multiple Gm cells with common mode feedback 230, an input impedance match 240, an output impedance match 250 and an input gate bias 260. The Gm cells with common mode feedback 230 couple the transmission lines 210 and 220 together by the transconductance thereof. 271 and 272 refer to input node and output node of the DA circuit 200.

The input transmission line 210 includes inductors 211 at the beginning and end of the transmission line 210, and a series of inductors 212 connected between the inductors 211. The input transmission line 210 is terminated by the input impedance match 240. The input impedance match 240 includes for example a resistance 241 of 50 ohms and an RF bypass capacitor 242 coupled between the resistance 241 and ground.

The output transmission line 220 includes an inductor 221 at each end of the transmission line, and a series of inductances 222 connected between inductances 221. The termination for the output transmission line 220 is provided by the output impedance match 250 which has a 50 ohm resistance 251 and an RF bypass capacitor 252 coupled between the resistance 251 and ground.

The input transmission line 210 is coupled to the output transmission line 220 by the transconductance of N stages of the Gm cells 230.

The input gate bias 260 is provided by a current source 261 coupled in series with the drain of a transistor 262. With the drain of the transistor 262 coupled to its gates, and the gate of the transistor 262 coupled to the input transmission line 210 through an isolating resistance 273, equal bias currents are established in each of the Gm cell 230. That bias current is substantially equal to the current supplied by the current source 261.

The gate and drain capacitances of the transistors in the Gm cell 230 are absorbed into the inductors 211, 212, 221, and 222, thereby forming artificial transmission lines. When an input signal is applied to the amplifier's input terminal 271, the signal travels down the transmission line 210 to the terminating resistance 241 that absorbs the signal, thereby preventing any signal reflection. As the input signal travels down the input transmission line, the Gm cells 230 become excited by the traveling signal and transfer the signal to the output transmission line 220 through its transconductance. The signals output by the Gm cells 230 are summed at an output terminal 272. Any signal that propagates in the opposite direction is absorbed by the resistance 251.

Figure 3:
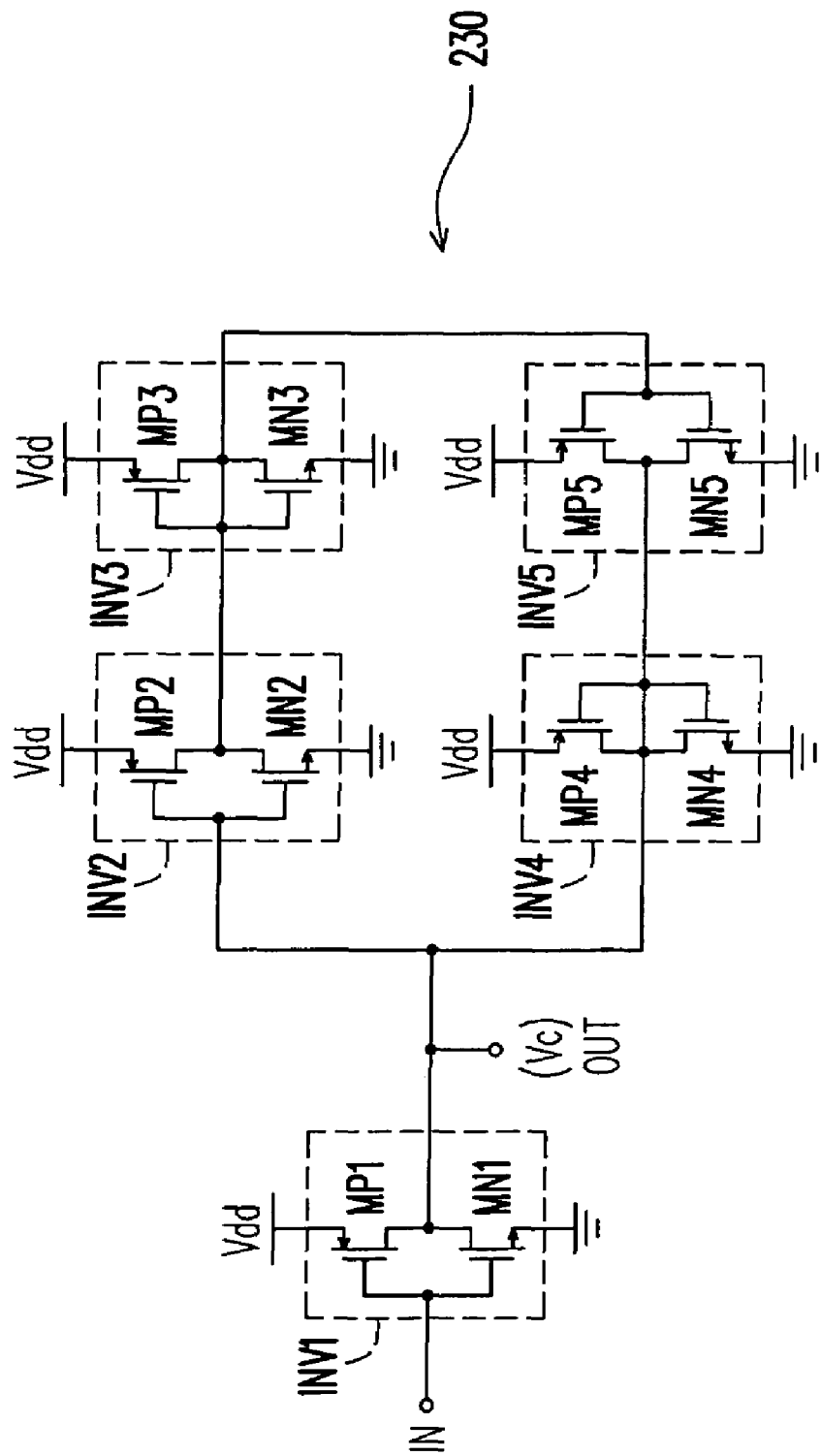
FIG. 3 shows schematic diagram for the Gm cell with common mode feedback.

FIG. 3 shows schematic diagram for the Gm cell with common mode feedback. As shown in FIG. 3, the Gm cell 230 has five CMOS inverter cores INV1~INV5. The input terminal IN of the Gm cell 230 is coupled to a corresponding inductor 212 and the output terminal OUT thereof coupled to a corresponding inductor 222. Each of the inverters has a PMOS transistor and an NMOS transistor. The PMOS transistor MP1 has a source terminal coupled to power supply Vdd, a gate terminal coupled to the corresponding inductor 212 and a drain terminal coupled to a drain terminal of the NMOS transistor MN1. The NMOS transistor MN1 has a source terminal coupled to GND, a gate terminal coupled to the corresponding inductor 212 and a drain terminal coupled to the drain terminal of the PMOS transistor MP1. The other CMOS inverters INV2~INV5 will be discussed more detailed in later section.

Input Impedance and Output Impedance

The input impedance match 240 and the output impedance match 250 own approximately linear phase over the passband. Additionally, the input impedance match 240 and the output impedance match 250 functions as DC block to reduce current consumption.

Gain & Bandwidth

As shown in FIG. 3, the DA is an inverter-based circuit that cascade with their gates by circular spiral inductor chains, and with their drains by another circular spiral inductor chains, respectively. As a result, the total gain can be increased by cascading more amplification stages (i.e. more Gm cells) without bandwidth degradation. The theoretical estimation of Gain G, and the cutoff frequency fc are:

$$G = \left(\frac{n*gm*Zo}{2}\right)^2 \quad (1)$$

$$fc = \frac{1}{2\pi\sqrt{LC}} \quad (2)$$

In equations (1) and (2), n is the number of the Gm cell stages, gm is the stage transconductance, Zo is the output resistance, L is the inductance, and C is the capacitance at the output node in the DA circuit 200.

The CMOS inverter at the bias point had a transconductance of about 35 mS, resulting in a predicted gain of 8.3 dB. Due to the absence of the internal nodes, the advantage of operation on parasitic is that all the parasitic capacitances are shunted parallel to the output nodes is very small, which is important at very high frequencies. So, the DA circuit according to the embodiment of the invention has a large bandwidth. Further, this CMOS inverter has no internal nodes and has a good linearity.

Current Reuse Issue

Figure 1:
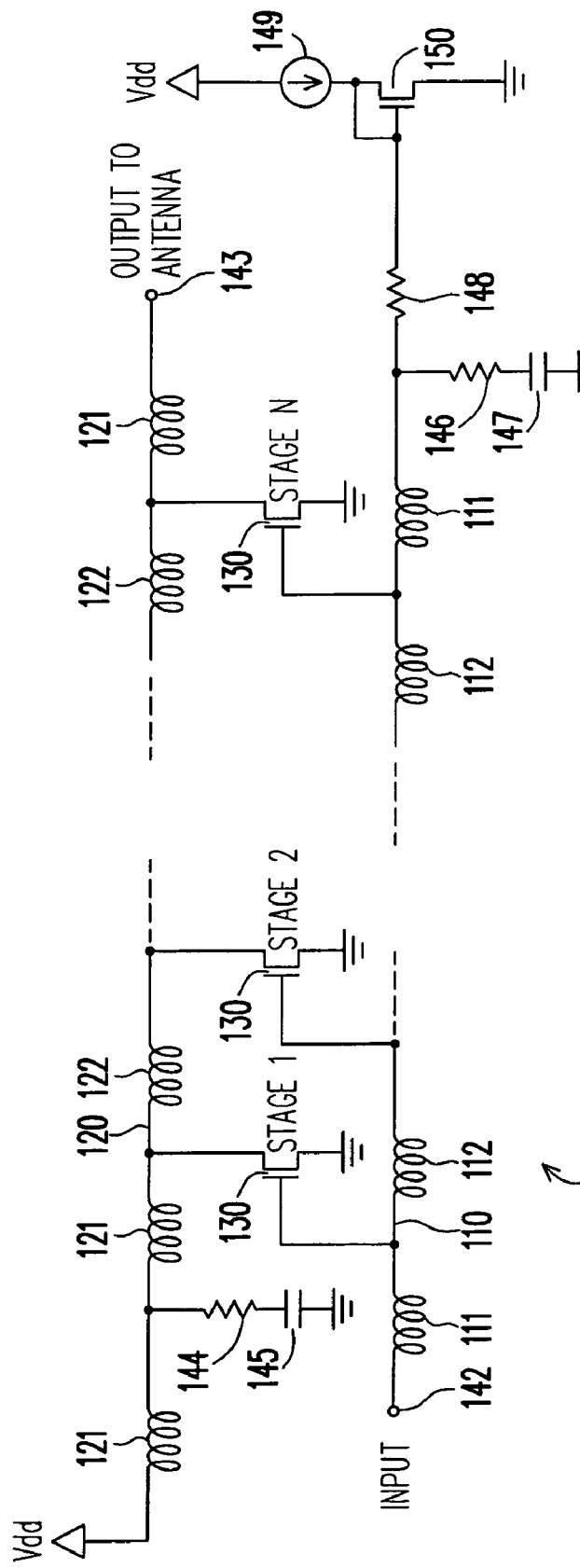
FIG. 1 shows a prior art distributed amplifier (DA) 100.

Main V/I conversion is performed by the CMOS inverter INV1. By this way, the maximum gain-bandwidth product with less current consumption is achieved. In order to get the same bandwidth as that of a common source based DA (in FIG. 1) and to keep the DC bias of the output node of each Gm cell 230 at half power supply voltage, the ratio of the width of PMOS and NMOS in proposed topology are 2.5:1. Only half of the current is consumed and the same transconductance value is obtained, compared with prior art shown in FIG. 1.

Output Common Mode Feedback

Due to the process, power supply, or temperature variation the common mode level of the output stage may vary and accordingly the maximum operation frequency at which they can be reliably used may be limited. Thus, there are four inverters INV2~INV5 with negative resistance to control the common mode level of the output voltage OUT and enhance the dc gain. The negative resistance generated from this common-mode feedback circuit is approximately:

$$gn = -\frac{1}{gm4 - gm5} \quad (3)$$

By choosing gm4>gm5, gm3=gm4, gm2=gm5, the negative resistance is simply implemented. Parameters gm2~gm5 refer to transconductance values of the inverter INV2~INV5. INV3 and INV4 are shunted as resistors connected between the output nodes OUT and the common voltage level, Vc (i.e. Vc=0.5*Vdd). The values of these resistors are 1/gm3 and 1/gm4. INV2 and INV5 inject currents gm2*(Vc−Vo) and gm5*(Vo−Vc) to these resistors (i.e. INV3 and INV4), respectively. Vc refers to the common voltage level of the output voltage at the output node OUT of the Gm cell 230.

Gain Peaking Effect

Since a flat gain response across the passband is preferred, so the staggering technique is used to eliminate the gain peaking effect in this embodiment. The staggering value is calculated as the ratio of the output transmission line cutoff frequency to the input transmission line cutoff frequency, a value of about 0.7 has been shown to be optimum. After optimization, the device dimensions of the Gm cell in this DA circuit are listed in Table I.

TABLE I

|  | W (μm) | L (μm) |
| --- | --- | --- |
| MP1 | 2.5 | 0.12 |
| MN1 | 1 | 0.12 |
| MP2~MP5 | 2.25 | 0.3 |
| MN2~MN5 | 0.9 | 0.3 |

Layout Consideration

In the die layout for the embodiment, all inductors are for example as being enclosed by ground metal to eliminate the coupling effect between inductors. The chip size is 1.3*1.4 mm². Based on the above design analysis, a single-end UWB DA based on Gm-C cell with common mode feedback is adopted to implement the wideband, low noise, high power gain and high linearity DA circuit, which may be used as LNA in the receiving part and as PA in the transmitting part.

Experimental Results

The measurements are performed on wafer and no extra component is added. Only one input 0.6V dc-bias voltage is applied in this circuit.

Figure 4:
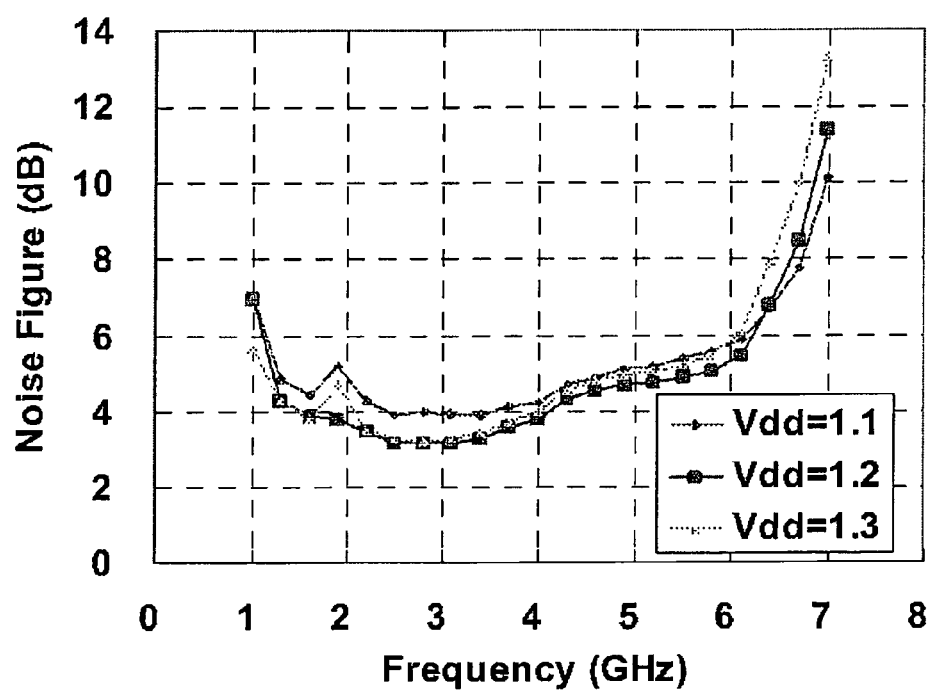
FIG. 4 shows a measured noise figure (NF) according to the embodiment of the invention.

FIG. 4 shows a measured noise figure (NF) of the embodiment. As seen from FIG. 4, during 1 GHz~6.5 GHz, the noise figure is smaller than 5 db, with minimal noise figure of about 3.3 dB. FIG. 4 is measured under Vdd=1.1V, Vdd=1.2V and Vdd=1.3V, respectively.

Figure 5:
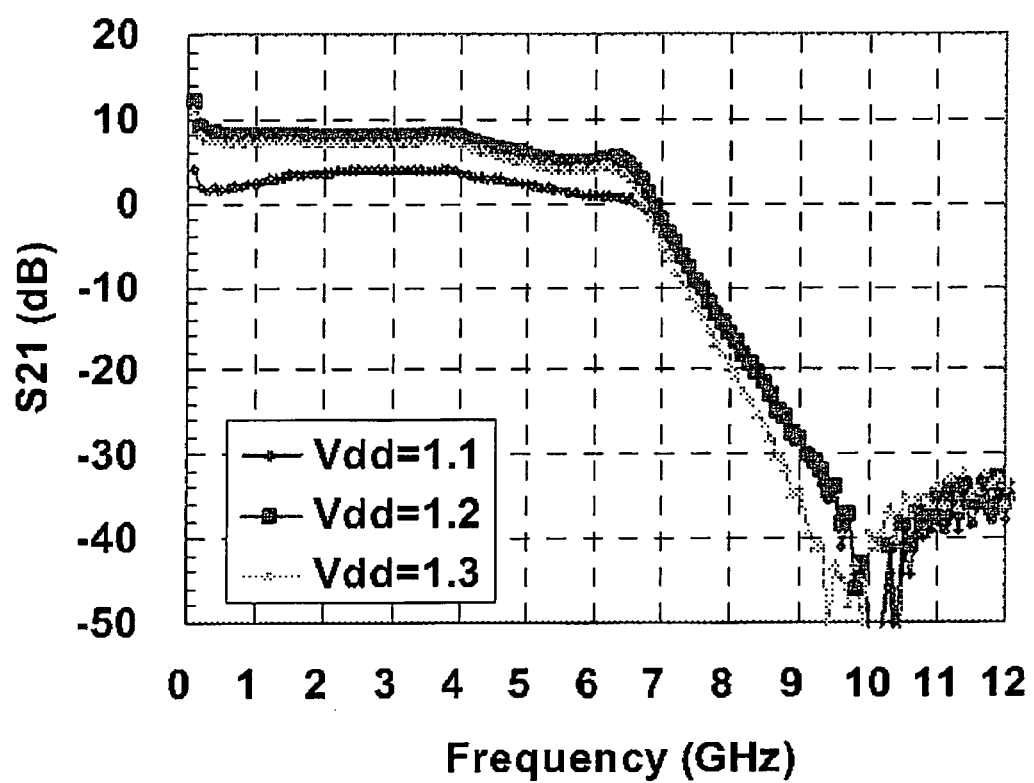
FIG. 5 shows the forward gain scattering parameter S21 according to the embodiment of the invention.

FIG. 5 shows the forward gain scattering parameter S21 of the embodiment. The parameter S21 was kept 8.3 dB over the frequency band of interest. Further, the cutoff frequency is about 6.5 GHz and the gain is about 10 db. This means, the embodiment has large bandwidth and high power gain. FIG. 5 is measured under Vdd=1.1V, Vdd=1.2V and Vdd=1.3V, respectively.

Figure 6:
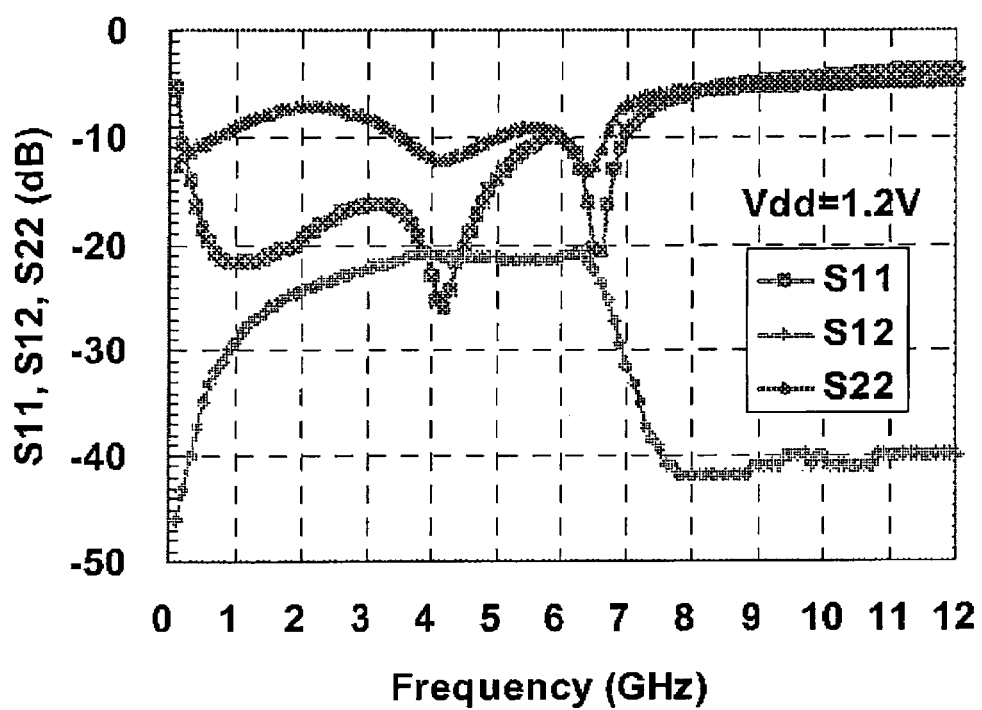
FIG. 6 shows the measured input return loss parameter S11, the output return loss parameter S22, and the reverse isolation parameter S12 according to the embodiment of the invention.

FIG. 6 shows the measured input return loss parameter S11, the output return loss parameter S22, and the reverse isolation parameter S12 of the embodiment. S11 is below −15 dB for Mode 1 OFDM application through the entire frequency band of interest. S12 is lower than −6 dB and S22 is lower than −20 dB. FIG. 6 shows good stability of the embodiment according to the invention. FIG. 6 is measured under Vdd=1.2V.

Figure 7:
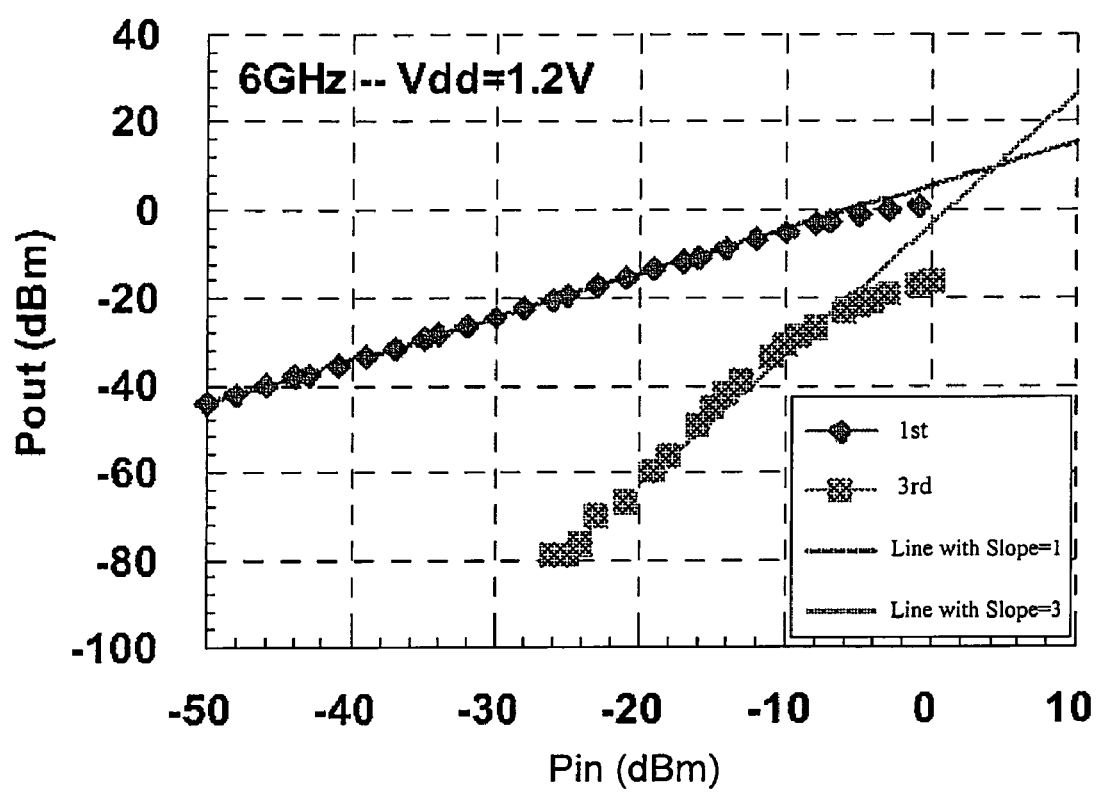
FIG. 7 shows the input third order intercept points (IIP3) at 6 GHz with 1 MHz spacing (i.e. 5.999 GHz) measurement results according to the embodiment of the invention.

FIG. 7 shows the input third order intercept points (IIP3) at 6 GHz with 1 MHz spacing (i.e. 5.999 GHz) measurement results. Two-tone tests at 2 GHz, 4 GHz, and 6 GHz with 1 MHz spacing are conducted and the results show input third order intercept points (IIP3) of 5.5 dBm, 4 dBm, and 3.5 dBm, respectively. The input 1 dB compression points (P1dB) are −5.8 dBm, -7.5 dBm, and −8 dBm when the input injected frequencies are at 2 GHz, 4 GHz, and 6 GHz, respectively. In FIG. 7, the lines with slope=1 and slope=3 are just for comparison. FIG. 7 shows stability analysis for the embodiment according to the invention.

Figure 8:
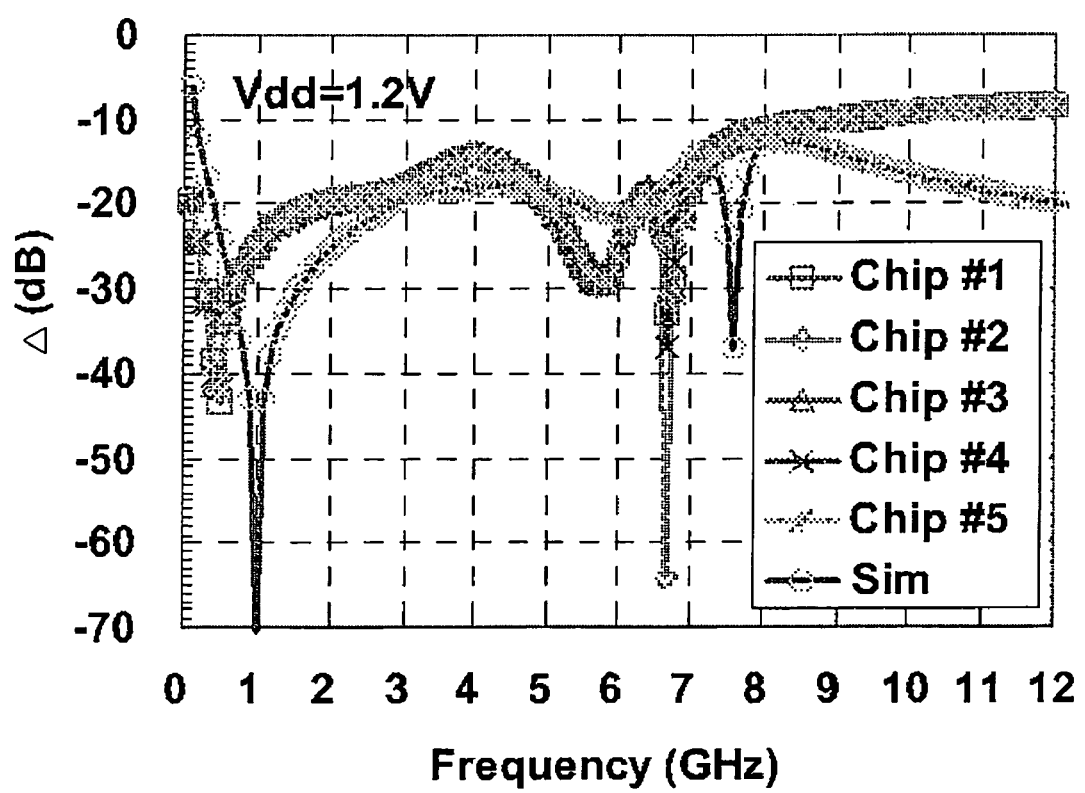
FIG. 8 and FIG. 9 show the stability factor Δ (delta) and Kf for the measured S-parameter data of different chips according to the embodiment of the invention.
Figure 9:
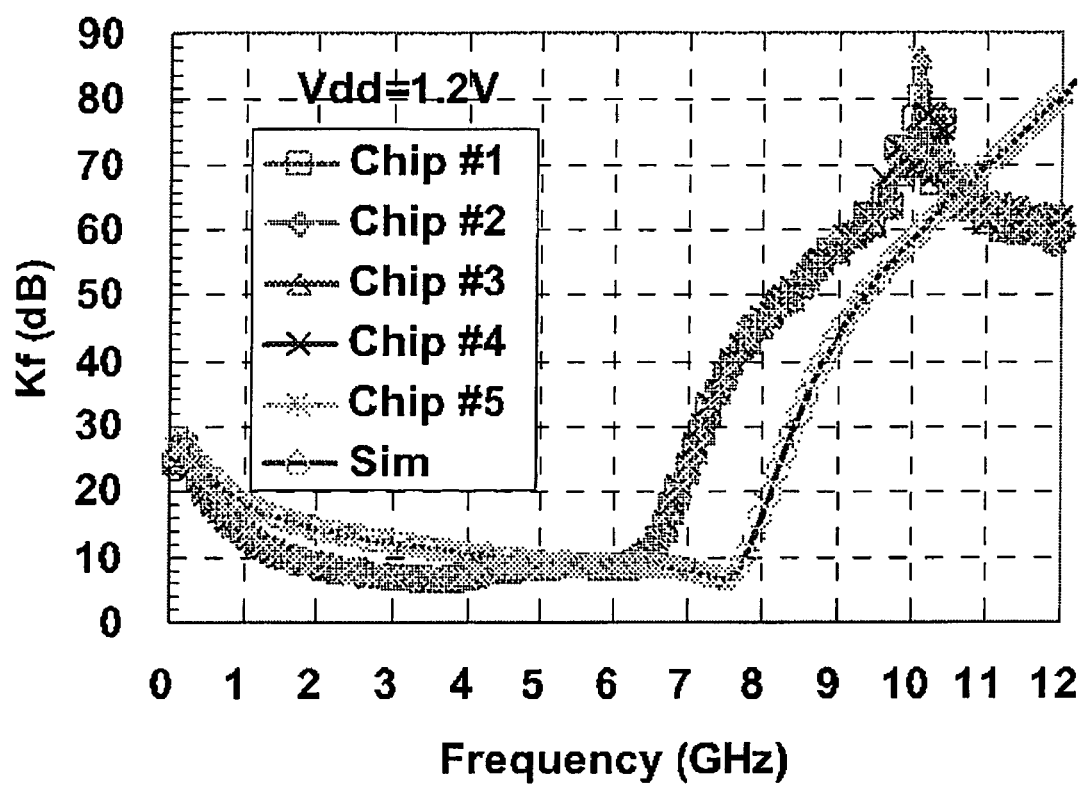

FIG. 8 and FIG. 9 show the stability factor Δ (delta) and Kf for the measured S-parameter data of different chips. For comparison, the simulation results are also shown. FIG. 8 shows the stability factor Δ (delta) for the measured S-parameter data of different chips (chip #1~#5) and simulation result, under Vdd=1.2V. FIG. 9 shows the stability factor Kf for the measured S-parameter data of different chips (chip #1~#5) and simulation result, under Vdd=1.2V.

The required conditions for an unconditional stable system are met in this embodiment according to the invention. The DA circuit according to the embodiment consumes 29.7 mW under 1.2V supply voltage.

A multi-stage, low power, low noise, and wideband UWB DA has been proposed in this embodiment. Operating in 4 GHz for Mode 1 OFDM applications, 8.3 dB gain with good gain flatness is provided, noise figure is as low as 3.3 dB over wide bandwidth, and an excellent input return loss below −15 dB is obtained. This also means less off-chip components and more confidence on simulation and the RF device model. For input frequencies at 2 GHz, 4 GHz, and 6 GHz, respectively, the IIP3 value is 5.5 dBm, 4 dBm, and 3.5 dBm, respectively. Further, NF=3.3 dB leads to spurious-free dynamic range. The overall measured performance is summarized in Table II.

TABLE II

|  | Simulation result | Measurement result | unit |
|---|---|---|---|
| S21 | 8.7 | 8.2 | dB |
| S11 | <−8 | <−6 | dB |
| S12 | <−14 | <−15 | dB |
| S22 | <−18 | <−20 | dB |
| Min. NF | 3 | 3.2 | dB |
| BandWidth | 7.6 | 6.5 | GHz |
| Vdd | 1.2 | 1.2 | V |
| I (Vdd) | 24.8 | 24.8 | mA |
| Power consumption | 29.7 | 29.7 | mW |
| P1 dB | −5.7 | −5.8 | dBm |
|  | −5.4 | −7.8 | dBm |
|  | −5.8 | −8 | dBm |
| IIP3, | 5.7 | 5.5 | dBm |
| frequency | 6.8 | 4 | dBm |
| spacing = 1 MHz | 6.4 | 3.5 | dBm |

Implemented in 0.13 μm MMRF CMOS technology, the experimental results demonstrate that the UWB DA circuit according to the embodiment paves the way to a new generation of compact, low power consumption, low noise, and high gain UWB wireless applications.

A characteristic of DA that is used to advantage by this embodiment is that the output power at terminal 272 is substantially equal to the sum of the individual power outputs of the cells 230. Using this characteristic, the number of cell stages 230 is substantially expanded beyond the number of stages that have been used for small signal amplifiers. Thus, if each cell stage 230 is capable of providing an output power of Q watts, and if the desired power output at terminal 272 is Pd watts, then the number N of cell stages 230 is selected to be equal to at least Pd /Q. For example, the DA shown in FIG. 2 was designed as the power output stage of a portable paging transmitter that is required to develop an output power Pd of 320 mW. Assuming that each cell 230 is capable of providing 20 mw, then 16 stages are required.

There are, however, other considerations to take into account when determining the value of N. The semiconductor area that is available for the DA may be large enough to allow an increase in the value of N, so that N exceeds the minimum value needed to provide the desired output power. By increasing the number of cell stages, the power associated with each cell stage can be reduced. If the semiconductor material permits heat to be removed relatively fast, then each cell stage may be operated at its maximum permissible power, and the number of cell stages may be reduced. In any case, the cell stages should be physically separated from each others by a distance that permits the chip to dissipate heat without damage.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A distributed amplifier in an RF signal transreceiver, the distributed amplifier comprising:
    an input transmission line, having an input for receiving an input signal to be amplifier;
    an output transmission line, having an output at which an output signal is provided;
    an input impedance match, for providing termination of the input transmission line and for preventing signal reflection in the input transmission line;
    an output impedance match, for providing termination of the output transmission line and for preventing signal reflection in the output transmission line;
    multi-stage Gm (transconductance) cells with common mode feedback, coupled between the input transmission line and the output transmission line, the input transmission line being coupled to the output transmission line by the transconductance of the Gm cells; and
    an input gate bias circuit, for providing bias for the multi-stage Gm cells;
    wherein at least one of the Gm cells including a plurality of inverters, one of the inverters being for performing V/I conversion, and the others of the inverters being for providing negative resistance to control common mode of output voltages of the Gm cell and to enhance DC gain of the Gm cell.

2. The distributed amplifier as set forth in claim 1, when the input signal travels through the input transmission line, the Gm cells become excited by the input signal and transfers the input signal to the output transmission line through their transconductance.

3. The distributed amplifier as set forth in claim 1, when the signals output by the Gm cells are summed at the output of the output transmission line.

4. The distributed amplifier as set forth in claim 1, wherein the input transmission line includes:
    first inductors at beginning and end of the input transmission line; and
    a series of second inductors connected between the first inductors.

5. The distributed amplifier as set forth in claim 4, wherein the input impedance match includes:
   a first resistance coupled to the first conductor at the end of the input transmission line; and
   a first RF bypass capacitor coupled between the first resistance and GND.

6. The distributed amplifier as set forth in claim 1, wherein the output transmission line includes:
   third inductors at beginning and end of the output transmission line; and
   a series of fourth inductors connected between the third inductors.

7. The distributed amplifier as set forth in claim 6, wherein the output impedance match includes:
   a second resistance coupled to the third conductor at the end of the output transmission line; and
   a second RF bypass capacitor coupled between the second resistance and GND.

8. The distributed amplifier as set forth in claim 1, wherein the input gate bias circuit includes:
   a current source; and
   a first transistor, the drain of the first transistor coupled to both its gates and the current source, the gate of the first transistor indirectly coupled to the input transmission line;
   wherein equal bias currents are established in each of the Gm cells and the bias currents are substantially equal to the current supplied by the current source.

9. The distributed amplifier as set forth in claim 1, wherein, for the at least one of the Gm cells, the others of the inverters being for providing negative resistance include at least four parallel and serially connected inverters, the negative resistance being implemented by choosing:
   gm4>gm5, gm3=gm4, gm2=gm5,
   gm2~gm5 refer to transconductance values of the four parallel and serially connected inverters.

10. The distributed amplifier as set forth in claim 9, wherein, for the at least one of the Gm cells, two of the four parallel and serially connected inverters are shunted as resistors connected between an output node of the Gm cell and a common mode voltage level.

11. The distributed amplifier as set forth in claim 10, wherein, for the at least one of the Gm cells, the other two of the four parallel and serially connected inverters inject currents to the two of the four parallel and serially connected inverters, respectively.

12. A distributed amplifier in an RF signal transreceiver, the distributed amplifier comprising:
   an input transmission line, having an input for receiving an input signal to be amplifier;
   an output transmission line, having an output at which an output signal is provided;
   an input impedance match, for providing termination of the input transmission line and for preventing signal reflection in the input transmission line;
   an output impedance match, for providing termination of the output transmission line and for preventing signal reflection in the output transmission line;
   multi-stage Gm (transconductance) cells with common mode feedback, coupled between the input transmission line and the output transmission line, the input transmission line being coupled to the output transmission line by the transconductance of the Gm cells; and
   an input gate bias circuit, for providing bias for the multi-stage Gm cells;
   wherein at least one of the Gm cells including:
   a first CMOS inverter, coupled between an input node and an output node of the Gm cell, the first CMOS inverter being for performing V/I conversion; and
   second, third, fourth and fifth CMOS inverters, coupled to the first CMOS inverter, the second, third, fourth and fifth CMOS inverters being for providing negative resistance to control common mode of output voltages of the Gm cell and to enhance DC gain of the Gm cell;
   the negative resistance, expressed by expressed by $$gn = -\frac{1}{gm4 - gm5},$$

being implemented by choosing:
   gm4>gm5, gm3=gm4, gm2=gm5,
   gm2~gm5 refer to transconductance values of the second, third, fourth and fifth CMOS inverters.

13. The distributed amplifier as set forth in claim 12, when the input signal travels through the input transmission line, the Gm cells become excited by the input signal and transfers the input signal to the output transmission line through their transconductance.

14. The distributed amplifier as set forth in claim 12, when the signals output by the Gm cells are summed at the output of the output transmission line.

15. The distributed amplifier as set forth in claim 12, wherein the input transmission line includes:
   first inductors at beginning and end of the input transmission line; and
   a series of second inductors connected between the first inductors.

16. The distributed amplifier as set forth in claim 15, wherein the input impedance match includes:
   a first resistance coupled to the first conductor at the end of the input transmission line; and
   a first RF bypass capacitor coupled between the first resistance and GND.

17. The distributed amplifier as set forth in claim 12, wherein the output transmission line includes:
   third inductors at beginning and end of the output transmission line; and
   a series of fourth inductors connected between the third inductors.

18. The distributed amplifier as set forth in claim 17, wherein the output impedance match includes:
   a second resistance coupled to the third conductor at the end of the output transmission line; and
   a second RF bypass capacitor coupled between the second resistance and GND.

19. The distributed amplifier as set forth in claim 12, wherein the input gate bias circuit includes:
   a current source; and
   a first transistor, the drain of the first transistor coupled to both its gates and the current source, the gate of the first transistor indirectly coupled to the input transmission line;
   wherein equal bias currents are established in each of the Gm cells and the bias currents are substantially equal to the current supplied by the current source.

20. The distributed amplifier as set forth in claim 12, wherein, for the at least one of the Gm cells,
   the third and the fourth CMOS inverters are shunted as resistors connected between an output node of the Gm cell and a common mode voltage level; and
   the second and the fifth CMOS inverters inject currents to the third and the fourth inverters, respectively.

* * * * *